(12) United States Patent
Botula et al.

(10) Patent No.: US 9,165,819 B2
(45) Date of Patent: Oct. 20, 2015

(54) HIGH LINEARITY SOI WAFER FOR LOW-DISTORTION CIRCUIT APPLICATIONS

(71) Applicant: International Business Machines Corporation, Armonk, NY (US)

(72) Inventors: Alan B. Botula, Essex Junction, VT (US); Jeffrey E. Hanrahan, Burlington, VT (US); Mark D. Jaffe, Shelburne, VT (US); Alvin J. Joseph, Williston, VT (US); Dale W. Martin, Hyde Park, VT (US); Gerd Pfeiffer, Poughquag, NY (US); James A. Slinkman, Montpelier, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/546,058

(22) Filed: Nov. 18, 2014

(65) Prior Publication Data
US 2015/0072504 A1  Mar. 12, 2015

Related U.S. Application Data

(62) Division of application No. 13/929,955, filed on Jun. 28, 2013, now Pat. No. 8,951,896.

(51) Int. Cl.
*H01L 21/76* (2006.01)
*H01L 21/04* (2006.01)
(Continued)

(52) U.S. Cl.
CPC .......... *H01L 21/76251* (2013.01); *H01L 21/04* (2013.01); *H01L 21/265* (2013.01); *H01L 21/324* (2013.01)

(58) Field of Classification Search
CPC .................... H01L 21/02038; H01L 21/76297

USPC ................................. 257/347–354, E29.287, 257/E21.561–E21.57, E21.7–E21.704
See application file for complete search history.

(56) References Cited

U.S. PATENT DOCUMENTS

| 4,601,779 A | 7/1986 | Abernathey et al. |
| 6,559,470 B2 | 5/2003 | Tsu-Jae |

(Continued)

FOREIGN PATENT DOCUMENTS

| WO | 2010/002515 A2 | 1/2010 |
| WO | 2011/067394 A1 | 6/2011 |
| WO | 2012/127006 A1 | 9/2012 |

OTHER PUBLICATIONS

Jean-Pierre Raskin, "SOI Technology: An Opportunity for RF Designers?" Journal of Telecoomunications and Information Technology, Apr. 2009, pp. 1-15.

(Continued)

*Primary Examiner* — Mamadou Diallo
(74) *Attorney, Agent, or Firm* — Gibb & Riley, LLC; Anthony Canale

(57) ABSTRACT

According to a method herein, a first side of a substrate is implanted with a first material to change a crystalline structure of the first side of the substrate from a first crystalline state to a second crystalline state, after the first material is implanted. A second material is deposited on the first side of the substrate, after the first material is implanted. A first side of an insulator layer is bonded to the second material on the first side of the substrate. Integrated circuit devices are formed on a second side of the insulator layer, opposite the first side of the insulator layer, after the insulator layer is bonded to the second material. The integrated circuit devices are thermally annealed. The first material maintains the second crystalline state of the first side of the substrate during the annealing.

20 Claims, 6 Drawing Sheets

(51) Int. Cl.
  *H01L 21/762* (2006.01)
  *H01L 21/265* (2006.01)
  *H01L 21/324* (2006.01)

(56) References Cited

U.S. PATENT DOCUMENTS

| | | |
|---|---|---|
| 6,956,262 B1 | 10/2005 | Tsu-Jae |
| 7,224,002 B2 | 5/2007 | Bhattacharyya |
| 7,485,551 B2 | 2/2009 | Hebras |
| 7,736,960 B2 * | 6/2010 | Yamazaki et al. ............ 438/166 |
| 7,745,309 B2 | 6/2010 | Thakur et al. |
| 7,915,706 B1 | 3/2011 | Kerr et al. |
| 8,076,750 B1 | 12/2011 | Kerr et al. |
| 8,367,521 B2 | 2/2013 | Daval et al. |
| 8,426,280 B2 | 4/2013 | Dong |
| 8,536,035 B2 | 9/2013 | Botula et al. |
| 8,741,739 B2 | 6/2014 | Botula et al. |
| 2002/0187619 A1 | 12/2002 | Kleinhenz et al. |
| 2007/0032040 A1 | 2/2007 | Lederer |
| 2011/0018060 A1 | 1/2011 | Botula et al. |
| 2011/0127529 A1 | 6/2011 | Botula et al. |
| 2012/0161310 A1 | 6/2012 | Brindle et al. |
| 2012/0244687 A1 | 9/2012 | Kononchuk et al. |
| 2012/0319121 A1 | 12/2012 | Reynaud et al. |

OTHER PUBLICATIONS

U.S. Appl. No. 13/929,955 Office Communication Dated May 14, 2014, pp. 1-6.

U.S. Appl. No. 13/929,955 Office Communication Dated Jul. 11, 2014, pp. 1-9.

U.S. Appl. No. 13/929,955 Notice of Allowance Communication Dated Sep. 26, 2014, pp. 1-9.

* cited by examiner

HIGH LINEARITY SOI WAFER FOR LOW-DISTORTION CIRCUIT APPLICATIONS

CROSS-REFERENCE TO RELATED APPLICATIONS

This application is a divisional of U.S. patent application Ser. No. 13/929,955, filed Jun. 28, 2013, the complete disclosure of which is incorporated herein by reference.

BACKGROUND

The present disclosure relates to semiconductor structures and, more particularly, to a silicon-on-insulator (SOI) structure configured for low-distortion circuit applications.

Silicon-on-insulator (SOI) structures typically comprise a silicon substrate, an insulator layer (e.g., a buried oxide (BOX) layer) above the substrate, and a device layer (i.e., a silicon layer from which integrated circuit devices are formed) above the insulator layer. Such SOI structures offer a number of advantages over bulk silicon structures with respect to the formation of integrated circuit devices generally (e.g., reduction in parasitic capacitances, elimination of latch-up, better control of short channel effects, etc.). In many integrated circuits, such as radio frequency (RF) circuits fabricated on SOI substrates, performance of the circuit has not been as expected.

High frequency circuits built on SOI substrates, such as RF switches, tuners, and receivers, require very high linearity so as not to generate intermodulation products or harmonic distortion. Substrate contributions to total distortion can be substantial, and methods to suppress substrate effects are a significant technology enabler for semiconductor technology offerings built on SOI wafers.

SUMMARY

Methods and devices herein relate to techniques to maintain effectiveness of the damaged or non-crystalline layer of a substrate. The techniques described herein are performed prior to SOI wafer bonding. The techniques described herein reduce costs by inserting a relatively simple process into the SOI wafer manufacturing flow, while removing more complex operations from the semiconductor fabrication flow.

According to a method herein, a first side of a substrate is implanted with a first material to change a crystalline structure of the first side of the substrate from a first crystalline state to a second crystalline state, after the first material is implanted. A second material is deposited on the first side of the substrate, after the first material is implanted. A first side of an insulator layer is bonded to the second material on the first side of the substrate. Integrated circuit devices are formed on a second side of the insulator layer, opposite the first side of the insulator layer, after the insulator layer is bonded to the second material. The integrated circuit devices are thermally annealed. The first material maintains the second crystalline state of the first side of the substrate during the annealing.

According to another method herein, a first side of a substrate is implanted with a first material to change a crystalline structure of the first side of the substrate from a first crystalline state to a second crystalline state, after the first material is implanted. A second material is deposited on the first side of the substrate, after the first material is implanted. A third material is implanted into a top surface of the second material. A first side of an insulator layer is bonded to the second material on the top surface of the second material. Integrated circuit devices are formed on a second side of the insulator layer, opposite the first side of the insulator layer, after the insulator layer is bonded to the second material. The integrated circuit devices are thermally annealed. The first material maintains the second crystalline state of the first side of the substrate during the annealing.

According to yet another method herein, a first side of a substrate is implanted with a first material to change a crystalline structure of the first side of the substrate from a first crystalline state to a second crystalline state. A second material is co-implanted in the first side of the substrate. A first side of an insulator layer is bonded to the first side of the substrate, after the first and second materials have been implanted. Integrated circuit devices are formed on a second side of the insulator layer, opposite the first side of the insulator layer, after the insulator layer is bonded to the substrate. The integrated circuit devices are thermally annealed. The second material maintains the second crystalline state of the first side of the substrate during the annealing.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
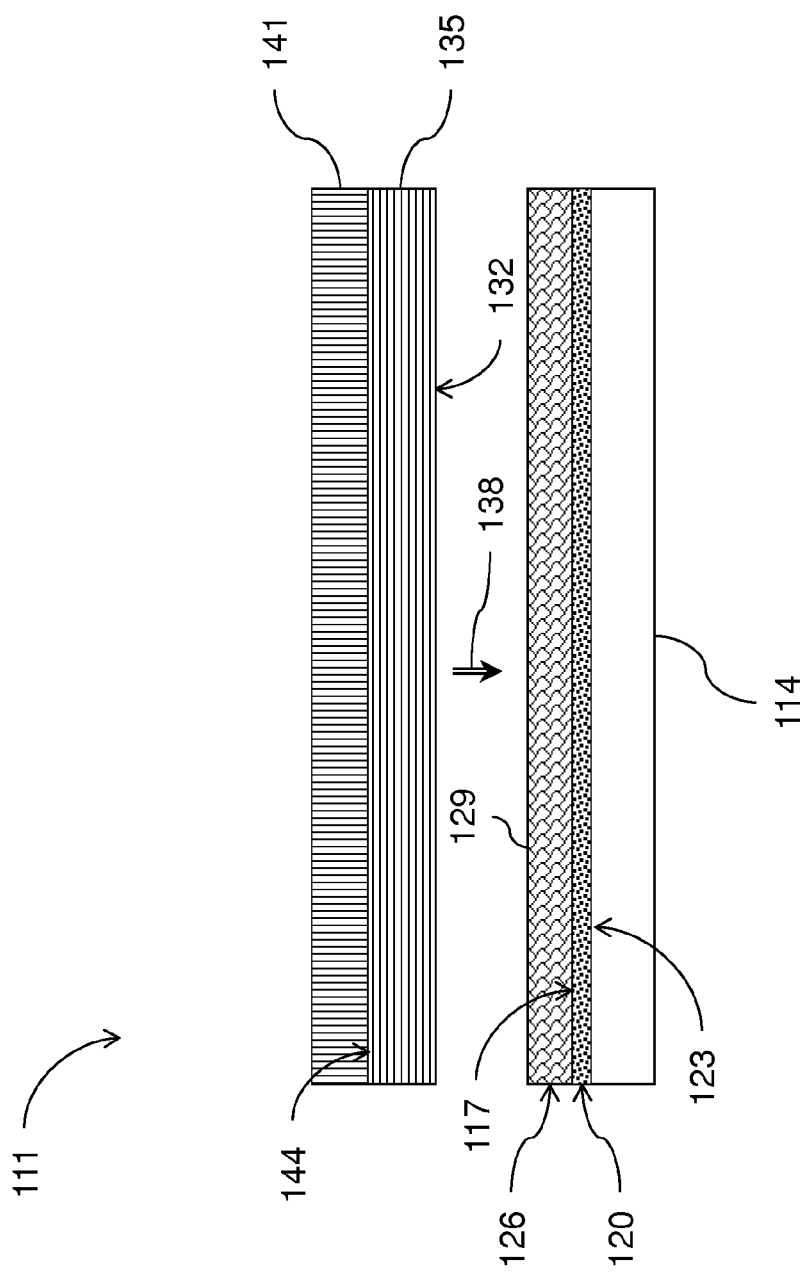
FIG. 1 is a block diagram illustrating a substrate structure according to devices and methods herein.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

Referring to the drawings, FIG. 1 shows a structure, indicated generally as 111, according to devices and methods herein. The structure 111 includes a base substrate 114 having a top surface 117 on a first side of the base substrate 114. According to devices and methods herein, the base substrate 114 comprises high resistivity silicon. The use of high resistivity silicon for the base substrate 114 reduces high frequency losses associated with the conductivity of the substrate, as much as possible. A first material, indicated generally as 120, is implanted in a top portion 123 of the base substrate 114. The first material 120 is selected to change the crystalline structure of the first side of the base substrate 114 from a first crystalline state to a second crystalline state, after the first material 120 is implanted. The first material 120 may be selected from a species that will inhibit annealing or recrystallization of the base substrate 114 during subsequent processing. Non-limiting examples of such first material 120 include: argon (Ar), neon (Ne), helium (He), xenon (Xe), krypton (Kr), carbon (C), and nitrogen (N). Other materials may be used. It is contemplated that one or more species may be used as the first material 120.

After the base substrate 114 has been implanted with the first material 120, a second material 126 is deposited on the top surface 117 of the base substrate 114 to form a trap-rich layer 129. The trap-rich layer 129 may be a polycrystalline or amorphous film. Non-limiting examples of such polycrystalline film include: poly-silicon (Si), poly-germanium (Ge), poly-silicon-germanium (SiGe), and poly-silicon carbide (SiC). As used herein the term "trap-rich layer" generally refers to a layer having a high density of electrical charge traps. According to devices and methods herein, an exemplary trap-rich layer 129 may have a thickness of approximately 1-5 microns.

After processing of the base substrate 114, as described above, a first side 132 of an insulator layer 135 is bonded to the trap-rich layer 129 made of the second material 126 on the first side of the base substrate 114, as indicated by arrow 138. Integrated circuit devices are formed on a wafer 141 disposed on a second side 144 of the insulator layer 135. The insulator layer 135 may comprise a buried oxide (BOX) layer. The BOX layer provides electrical isolation between the base substrate 114 and integrated circuitry implemented in the wafer 141.

According to devices and methods herein, the integrated circuit devices formed on the wafer 141 are thermally annealed. The first material 120 inhibits re-crystallization of the base substrate 114 and the trap-rich layer 129 during the annealing. In other words, the first material 120 maintains the second crystalline state of the first side of the base substrate 114 and inhibits recrystallization of the trap-rich layer without requiring an interfacial dielectric layer. Additionally, the trap-rich layer 129 suppresses surface conduction over the entire structure.

As summarized above, processing of semiconductor devices, and in particular the production of active devices in the wafer 141 generally involves high temperature processes conducted at temperatures from 1000° C. to 1100° C. Such high temperature processing of semiconductor structures acts to anneal defects in the crystal lattice of the entire device, including the base substrate 114. This effect is commonly utilized to enhance the electrical properties of electrical circuits. However, the performance of the trap-rich layer 129 formed from amorphous or polycrystalline silicon crystal patterns is actually decreased when imperfections are annealed out, since the number of traps is decreased. According to devices and methods herein, the first material 120 inhibits re-crystallization of the base substrate 114 and the trap-rich layer 129 during the annealing.

Figure 2:
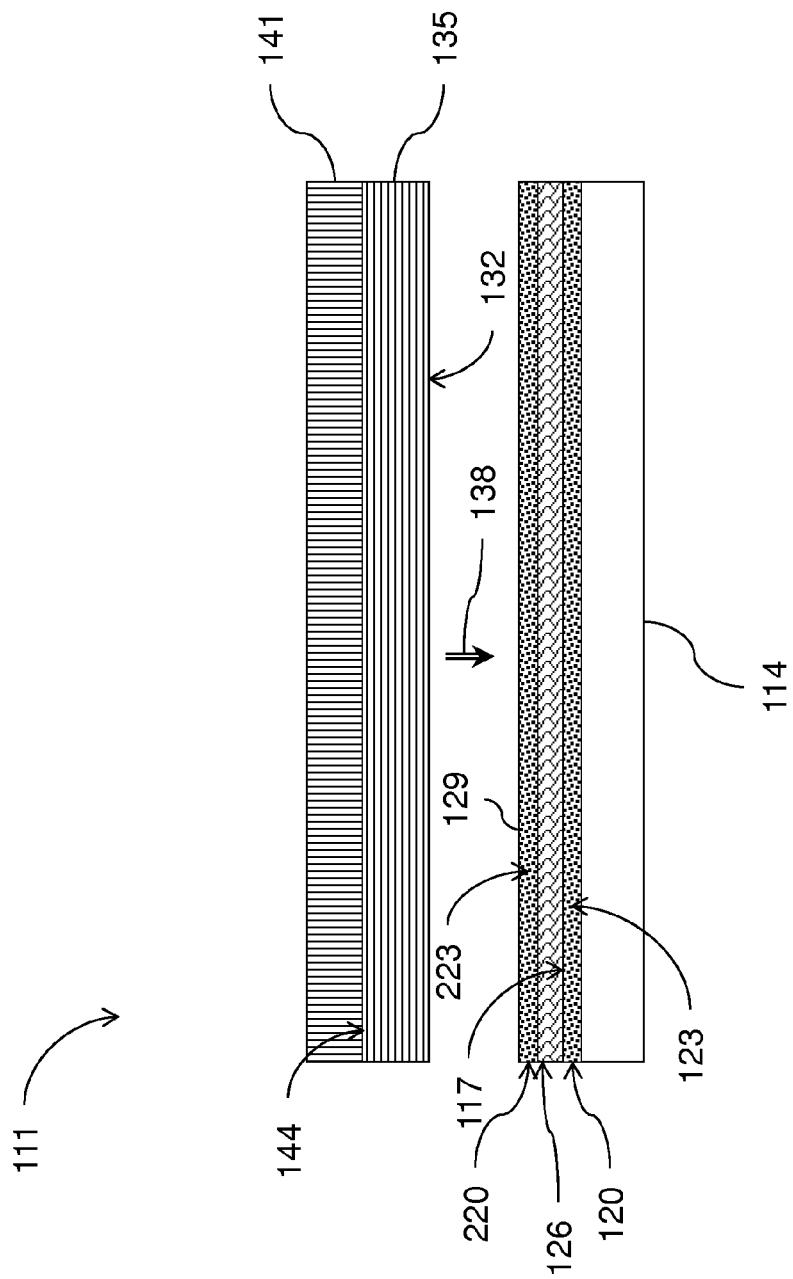
FIG. 2 is a block diagram illustrating a substrate structure according to devices and methods herein.

FIG. 2 shows the structure 111 of FIG. 1 in which a third material, indicated generally as 220, is implanted in a top portion 223 of the trap-rich layer 129. Non-limiting examples of such third material 220 include: argon (Ar), neon (Ne), helium (He), xenon (Xe), krypton (Kr), carbon (C), and nitrogen (N). Other materials may be used. It is contemplated that one or more species may be used as the third material 220. The third material 220 is implanted in order to improve the effectiveness of the trap-rich layer 129.

Figure 3:
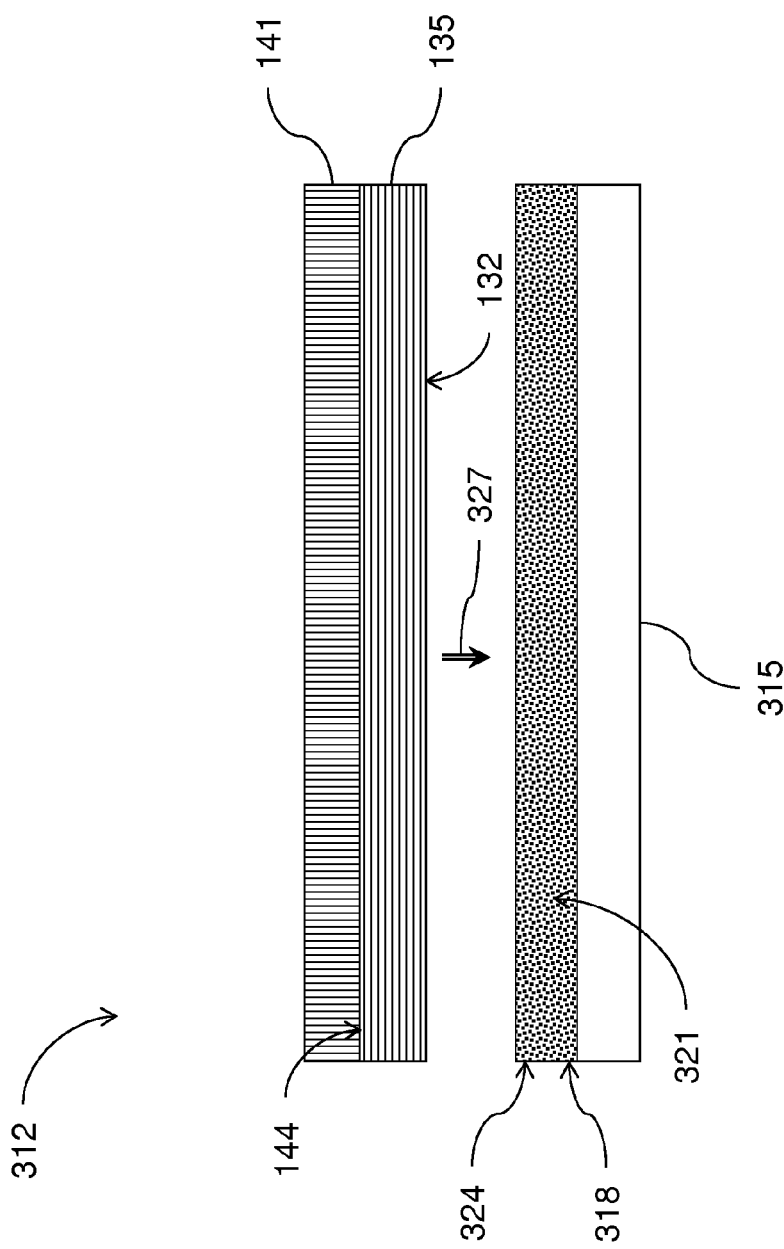
FIG. 3 is a block diagram illustrating a substrate structure according to devices and methods herein.

FIG. 3 shows an alternate structure, indicated generally as 312, according to devices and methods herein. The alternate structure 312 includes a base substrate 315. According to devices and methods herein, the base substrate 315 comprises high resistivity silicon. The use of high resistivity silicon for the base substrate 315 reduces high frequency losses associated with the conductivity of the substrate, as much as possible. A first material, indicated generally as 318, is implanted in a top portion 321 of the base substrate 315. The first material 318 is selected from a species that will induce damage of the top portion 321 of the base substrate 315. The first material 318 may be selected to change the crystalline structure of the first side of the base substrate 315 from a first crystalline state to a second crystalline state, after the first material 318 is implanted. Non-limiting examples of such first material species include: argon (Ar), neon (Ne), helium (He), xenon (Xe), and krypton (Kr). Other materials may be used. It is contemplated that one or more species may be used as the first material 318. A second material, indicated generally as 324, is co-implanted into the top portion 321 of the base substrate 315. The second material 324 may be selected to inhibit annealing of the damage in the base substrate 315 caused by the first material 318. Non-limiting examples of such second material species include: carbon (C), germanium (Ge), and nitrogen (N). As used herein, 'co-implanted' means that the selected materials go into the same area of the base substrate 315. Implanting may be done simultaneously or sequentially. According to devices and methods herein, an exemplary top portion 321 of the base substrate 315, wherein the implanting occurs, may have a thickness of approximately 1-5 microns.

After processing of the base substrate 315, that is after the first and second materials 318, 324 have been implanted, as described above, a first side 132 of an insulator layer 135 is bonded to the first side of the base substrate 315, as indicated by arrow 327. Integrated circuit devices are formed on a wafer 141 disposed on a second side 144 of the insulator layer 135. The insulator layer 135 may comprise a buried oxide (BOX) layer. The BOX layer provides electrical isolation between the base substrate 114 and integrated circuitry implemented in the wafer 141.

According to devices and methods herein, the integrated circuit devices formed on the wafer 141 are thermally annealed. The second material 324 inhibits re-crystallization of the base substrate 315 during the annealing. In other words, the second material 324 maintains the second crystalline state of the first side of the base substrate 315.

According to devices and methods herein, the first material 318 co-implanted with the second material 324 suppresses surface conduction on the base substrate 315 without requiring deposition of an additional layer.

Figure 4:
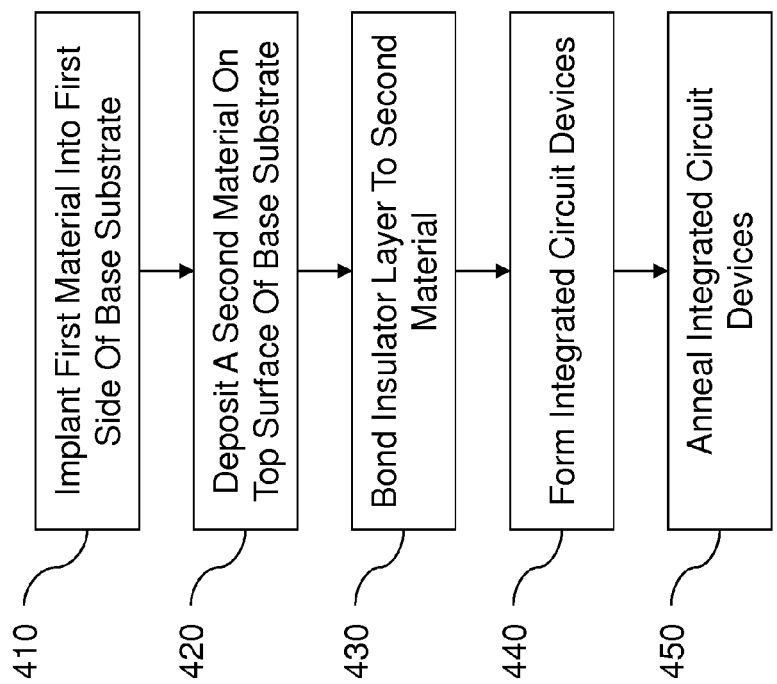
FIG. 4 is a flow diagram according to a method herein.

FIG. 4 is a flow diagram illustrating the processing flow of an exemplary method according to devices and methods herein. At 410, a first material is implanted into a first side of a base substrate to change a crystalline structure of the first side of the base substrate from a first crystalline state to a second crystalline state, after the first material is implanted. Non-limiting examples of such first material include: argon (Ar), neon (Ne), helium (He), xenon (Xe), krypton (Kr), carbon (C), and nitrogen (N). According to devices and methods herein, the base substrate may be formed of a high resistance material. Following the implanting, a second material is deposited on the first side of the base substrate, at 420. The second material forms a trap-rich layer on the top surface of the base substrate. The trap-rich layer may be a polycrystalline or amorphous layer. Non-limiting examples of such polycrystalline layer include: poly-silicon (Si), poly-germanium (Ge), poly-silicon-germanium (SiGe), and poly-silicon carbide (SiC). At 430, a first side of an insulator layer is bonded to the second material on the first side of the base substrate. Integrated circuit devices are formed on a second side of the insulator layer, at 440. The integrated circuits are formed on a side opposite the first side of the insulator layer, after the insulator layer is bonded to the second material. At 450, the integrated circuit devices are thermally annealed. The first material maintains the second crystalline state of the first side of the base substrate during the annealing.

Figure 5:
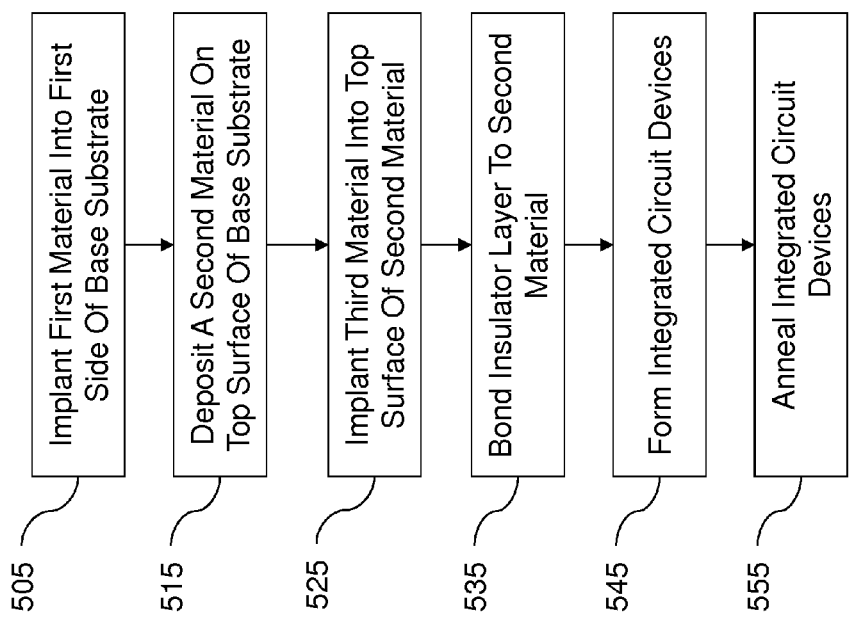
FIG. 5 is a flow diagram according to another method herein.

FIG. 5 is a flow diagram illustrating the processing flow of another exemplary method according to devices and methods herein. At 505, a first material is implanted into a first side of a base substrate to change a crystalline structure of the first side of the base substrate from a first crystalline state to a second crystalline state, after the first material is implanted. Non-limiting examples of such first material include: argon (Ar), neon (Ne), helium (He), xenon (Xe), krypton (Kr), carbon (C), and nitrogen (N). According to devices and methods herein, the base substrate may be formed of a high resistance material. Following the implanting, a second material is deposited on the first side of the base substrate, at 515. The second material forms a trap-rich layer on the top surface of the base substrate. The trap-rich layer may be a polycrystalline or amorphous layer. Non-limiting examples of such polycrystalline layer include: poly-silicon (Si), poly-germanium (Ge), poly-silicon-germanium (SiGe), and poly-silicon carbide (SiC). At 525, a third material is implanted into a top surface of the second material. At 535, a first side of an insulator layer is bonded to the second material on the first side of the base substrate. Integrated circuit devices are formed on a second side of the insulator layer, at 545. The integrated circuits are formed on a side opposite the first side of the insulator layer, after the insulator layer is bonded to the second material. At 555, the integrated circuit devices are thermally annealed. The first material maintains the second crystalline state of the first side of the base substrate during the annealing.

Figure 6:
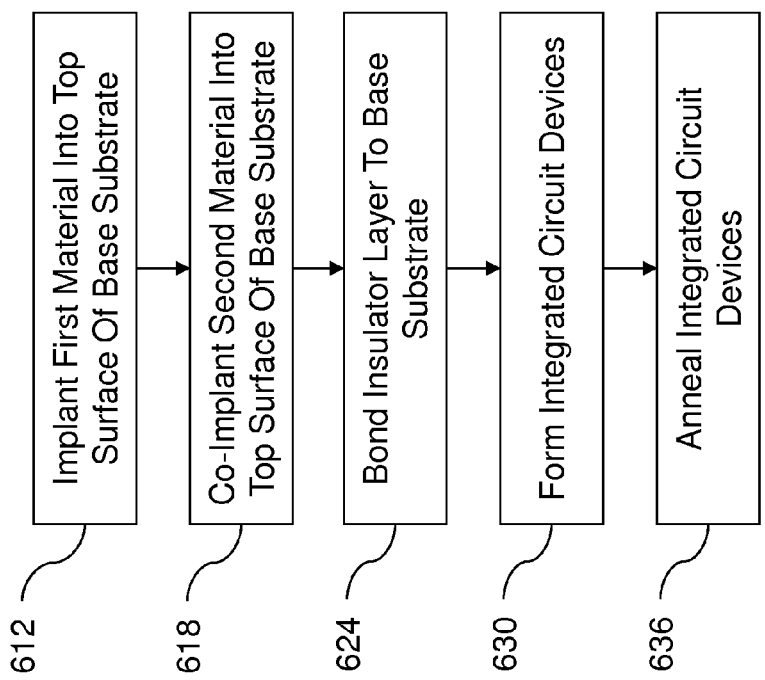
FIG. 6 is a flow diagram according to yet another method herein.

FIG. 6 is a flow diagram illustrating the processing flow of another exemplary method according to devices and methods herein. At 612, a first material is implanted into a top surface of a base substrate to change a crystalline structure of the first side of the base substrate from a first crystalline state to a second crystalline state. The first material is selected to induce damage of the top surface of the base substrate. Non-limiting examples of such first material species include: argon (Ar), neon (Ne), helium (He), xenon (Xe), and krypton (Kr). According to devices and methods herein, the base substrate may be formed of a high resistance material. At 618, a second material is co-implanted into the top surface of the base substrate. Non-limiting examples of such second material species include: carbon (C), germanium (Ge), and nitrogen (N). At 624, a first side of an insulator layer is bonded to the first side of the base substrate, after the first and second materials have been implanted. Integrated circuit devices are formed on a second side of the insulator layer, at 630. The integrated circuits are formed on a side opposite the first side of the insulator layer, after the insulator layer is bonded to the base substrate. At 636, the integrated circuit devices are thermally annealed. The second material maintains the second crystalline state of the first side of the base substrate during the annealing.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

A structure according to devices and methods herein may include a base substrate having an implanted region in a top portion of the base substrate. In one version of the structure herein, the implanted region comprises a trap-rich layer and may include a first material implanted into the top surface of the base substrate. The first material is selected to induce damage of the top surface of the base substrate. Non-limiting examples of such first material species include: argon (Ar), neon (Ne), helium (He), xenon (Xe), and krypton (Kr). The implant region may also include a second material co-implanted into the top surface of the base substrate. The second material is selected to inhibit damage annealing the base substrate. Non-limiting examples of such second material species include: carbon (C), germanium (Ge), and nitrogen (N). In another version of the structure herein, a trap-rich layer is on a surface of the top portion of the base substrate. The trap-rich layer may be a polycrystalline or amorphous layer. Non-limiting examples of such polycrystalline layer include: poly-silicon (Si), poly-germanium (Ge), poly-silicon-germanium (SiGe), and poly-silicon carbide (SiC). In yet another version of the structure herein, a material is implanted in the trap-rich layer. Non-limiting examples of such implanting material include: argon (Ar), neon (Ne), helium (He), xenon (Xe), and krypton (Kr). A wafer layer is located on top of the trap-rich layer. The wafer layer is separated from the base substrate by a buried oxide layer. The wafer layer may include integrated circuit devices that are annealed in their formation. The implant materials are selected to inhibit annealing of the damage in the base substrate caused by the implanting of the materials.

The flowchart and block diagrams in the Figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A method, comprising:
    implanting a first side of a substrate with a first material to change a crystalline structure of said first side of said substrate from a first crystalline state to a second crystalline state;
    implanting a second material in said first side of said substrate;
    bonding a first side of an insulator layer to said first side of said substrate, after said implanting;
    forming integrated circuit devices on a second side of said insulator layer, opposite said first side of said insulator layer, after said bonding; and
    thermally annealing said integrated circuit devices,
    said second material maintaining said second crystalline state of said first side of said substrate during said annealing.

2. The method according to claim 1, further comprising implanting said second material simultaneously with implanting said first material.

3. The method according to claim 1, said first material comprising one or more of:
    argon (Ar);
    neon (Ne);
    helium (He);
    xenon (Xe); and
    krypton (Kr).

4. The method according to claim 1, said second material comprising one or more of:
    carbon (C);
    germanium (Ge); and
    nitrogen (N).

5. The method according to claim 1, said second crystalline state comprising damage to said first side of said substrate, said second material maintaining said damage in said first side of said substrate during said annealing.

6. The method according to claim 1, said implanting said first material forming electrical charge traps in said first side of said substrate, said electrical charge traps suppressing parasitic conduction in said substrate degrading performance of said integrated circuit devices.

7. The method according to claim 1, said second material preventing said first side of said substrate from changing from said second crystalline state to said first crystalline state during said annealing.

8. A method, comprising:
    implanting a first side of a substrate with a first material to change a crystalline structure of said first side of said substrate from a first crystalline state to a second crystalline state;
    simultaneously implanting a second material in said first side of said substrate, producing an implanted top surface of said substrate;
    bonding a first side of an insulator layer to said implanted top surface of said substrate;
    forming integrated circuit devices on a second side of said insulator layer, opposite said first side of said insulator layer, after said bonding; and
    thermally annealing said integrated circuit devices.

9. The method according to claim 8, said first material comprising one or more of:
    argon (Ar);
    neon (Ne);
    helium (He);
    xenon (Xe); and
    krypton (Kr).

10. The method according to claim 8, said second material comprising one or more of:
    carbon (C);
    germanium (Ge); and
    nitrogen (N).

11. The method according to claim 8, said second crystalline state comprising damage to said first side of said substrate, said second material maintaining said damage in said first side of said substrate during said annealing.

12. The method according to claim 8, said implanting said first material forming electrical charge traps in said first side of said substrate, said electrical charge traps suppressing parasitic conduction in said substrate degrading performance of said integrated circuit devices.

13. The method according to claim 8, said second material preventing said first side of said substrate from changing from said second crystalline state to said first crystalline state during said annealing.

14. The method according to claim 8, said first material providing a trap-rich layer to insulate said substrate from said integrated circuit devices.

15. A method, comprising:
    providing a substrate having a top surface on a first side of said substrate, said substrate comprising high resistivity silicon;
    implanting a first material into said top surface of said substrate;

implanting a second material into said top surface of said substrate, producing an implanted top surface of said substrate, said implanting changing a crystalline structure of said first side of said substrate from a first crystalline state to a second crystalline state;

bonding a first side of an insulator layer to said implanted top surface of said substrate; and forming integrated circuit devices on a second side of said insulator layer, opposite said first side of said insulator layer, after said bonding.

16. The method according to claim 15, further comprising implanting said second material simultaneously with implanting said first material.

17. The method according to claim 15, further comprising: thermally annealing said integrated circuit devices.

18. The method according to claim 17, said second crystalline state comprising damage to said first side of said substrate, said first material inhibiting recrystallization of said first side of said substrate and said second material during said annealing.

19. The method according to claim 15, said implanting said first material forming electrical charge traps in said first side of said substrate, said electrical charge traps suppressing parasitic conduction in said substrate degrading performance of said integrated circuit devices.

20. The method according to claim 19, said electrical charge traps insulating said substrate from said integrated circuit devices.

\* \* \* \* \*